United States Patent
Thomsen et al.

(10) Patent No.: US 7,824,772 B2
(45) Date of Patent: Nov. 2, 2010

(54) SCRATCH RESISTANT COATED GLASS ARTICLE INCLUDING LAYER(S) RESISTANT TO FLUORIDE-BASED ETCHANT(S), AND METHOD OF MAKING ARTICLE USING COMBUSTION CVD

(75) Inventors: Scott V. Thomsen, South Lyon, MI (US); Rudolph Hugo Petrmichl, Ann Arbor, MI (US); Nestor P. Murphy, Oxford, MI (US); Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 98 days.

(21) Appl. No.: 12/149,334

(22) Filed: Apr. 30, 2008

(65) Prior Publication Data

US 2008/0226926 A1    Sep. 18, 2008

Related U.S. Application Data

(60) Division of application No. 10/996,044, filed on Nov. 24, 2004, now Pat. No. 7,387,816, which is a continuation-in-part of application No. 10/899,305, filed on Jul. 27, 2004, now Pat. No. 7,445,273, and a continuation-in-part of application No. 10/989,721, filed on Nov. 17, 2004.

(60) Provisional application No. 60/529,624, filed on Dec. 16, 2003, provisional application No. 60/529,103, filed on Dec. 15, 2003.

(51) Int. Cl.
    *B32B 9/00* (2006.01)

(52) U.S. Cl. ............ 428/408; 428/336; 428/428; 428/432; 428/698; 428/701; 428/702

(58) Field of Classification Search ............ 428/426, 428/428, 432, 698, 701, 702, 336, 408
See application file for complete search history.

(56) References Cited

U.S. PATENT DOCUMENTS 3,883,336 A     5/1975    Randall
4,242,373 A    12/1980    Watanabe et al.

(Continued)

FOREIGN PATENT DOCUMENTS

JP          11-084624          3/1999

(Continued)

OTHER PUBLICATIONS

U.S. Appl. No. 10/996,044, filed Nov. 24, 2004; Thomsen et al.

(Continued)

*Primary Examiner*—Archene Turner
(74) *Attorney, Agent, or Firm*—Nixon & Vanderhye P.C.

(57) ABSTRACT

A scratch resistant coated article is provided which is also resistant to attacks by at least some fluoride-based etchant(s) for at least a period of time. In certain example embodiments, an anti-etch layer(s) is provided on a glass substrate in order to protect the glass substrate from attacks by fluoride-based etchant(s), and an underlayer(s) deposited by flame pyrolysis may be provided under at least the anti-etch layer(s).

8 Claims, 4 Drawing Sheets

U.S. PATENT DOCUMENTS

| | | | |
|---|---|---|---|
| 4,308,316 | A | 12/1981 | Gordon |
| 4,336,119 | A | 6/1982 | Gillery |
| 4,353,885 | A | 10/1982 | Hoekje |
| 4,600,390 | A | 7/1986 | Göbel et al. |
| 4,620,988 | A | 11/1986 | Garschke et al. |
| 5,122,252 | A | 6/1992 | Latz et al. |
| 5,268,217 | A | 12/1993 | Kimock et al. |
| 5,384,154 | A | 1/1995 | De Bakker et al. |
| 5,387,433 | A | 2/1995 | Balian et al. |
| 5,635,245 | A | 6/1997 | Kimock et al. |
| 5,652,021 | A | 7/1997 | Hunt et al. |
| 5,935,735 | A | 8/1999 | Okubo et al. |
| 5,958,361 | A | 9/1999 | Laine et al. |
| 6,002,208 | A | 12/1999 | Maishev et al. |
| 6,077,569 | A | 6/2000 | Knapp et al. |
| 6,261,693 | B1 | 7/2001 | Veerasamy |
| 6,277,480 | B1 | 8/2001 | Veerasamy et al. |
| 6,284,377 | B1 | 9/2001 | Veerasamy |
| 6,291,054 | B1 | 9/2001 | Thomas et al. |
| 6,303,225 | B1 | 10/2001 | Veerasamy |
| 6,303,226 | B2 | 10/2001 | Veerasamy |
| 6,359,388 | B1 | 3/2002 | Petrmichl |
| 6,368,664 | B1 | 4/2002 | Veerasamy et al. |
| 6,387,346 | B1 | 5/2002 | Bertsch-Frank et al. |
| 6,447,891 | B1 | 9/2002 | Veerasamy et al. |
| 6,461,731 | B1 | 10/2002 | Veerasamy et al. |
| 6,472,017 | B2 | 10/2002 | Veerasamy et al. |
| 6,475,573 | B1 | 11/2002 | Veerasamy et al. |
| 6,513,435 | B2 | 2/2003 | Detzner |
| 6,592,992 | B2 | 7/2003 | Veerasamy |
| 6,592,993 | B2 | 7/2003 | Veerasamy |
| 6,610,360 | B2 | 8/2003 | Petrmichl et al. |
| 6,632,762 | B1 | 10/2003 | Zaykoski et al. |
| 6,635,307 | B2 | 10/2003 | Huang et al. |
| 6,665,033 | B2 | 12/2003 | Callegari et al. |
| 6,669,871 | B2 | 12/2003 | Kwon et al. |
| 6,686,050 | B2 | 2/2004 | Lingle et al. |
| 6,706,363 | B2 | 3/2004 | Honda et al. |
| 6,713,179 | B2 | 3/2004 | Veerasamy |
| 6,723,211 | B2 | 4/2004 | Lingle et al. |
| 6,756,119 | B1 | 6/2004 | Clough |
| 6,768,581 | B1 | 7/2004 | Yip et al. |
| 6,793,979 | B2 | 9/2004 | Veerasamy |
| 6,797,336 | B2 | 9/2004 | Garvey et al. |
| 6,905,776 | B1 | 6/2005 | Stollenwerk et al. |
| 7,387,816 | B2 | 6/2008 | Thomsen et al. |
| 2003/0118828 | A1 | 6/2003 | Briand et al. |
| 2004/0067363 | A1 | 4/2004 | Bienkiewicz et al. |
| 2004/0072016 | A1 | 4/2004 | Okazaki et al. |
| 2005/0129934 | A1 | 6/2005 | Veerasamy et al. |
| 2005/0181130 | A1 | 8/2005 | Thomsen et al. |
| 2006/0110605 | A1 | 5/2006 | Luten et al. |
| 2006/0110606 | A1 | 5/2006 | Luten |
| 2006/0115654 | A1 | 6/2006 | Thomsen |

FOREIGN PATENT DOCUMENTS

| | | | |
|---|---|---|---|
| WO | 01/55752 | * | 8/2001 |

OTHER PUBLICATIONS

U.S. Appl. No. 60/529,624, filed Dec. 16, 2003; Veerasamy.
U.S. Appl. No. 60/529,103, filed Dec. 15, 2003; Veerasamy.
U.S. Appl. No. 10/899,305, filed Jul. 27, 2004; Veerasamy et al.
U.S. Appl. No. 10/989,721, filed Nov. 17, 2004; Murphy et al.

* cited by examiner

SCRATCH RESISTANT COATED GLASS ARTICLE INCLUDING LAYER(S) RESISTANT TO FLUORIDE-BASED ETCHANT(S), AND METHOD OF MAKING ARTICLE USING COMBUSTION CVD

This application is a divisional of application Ser. No. 10/996,044, filed Nov. 24, 2004, now U.S. Pat. No. 7,387,816 which is a continuation-in-part (CIP) of U.S. patent application Ser. No. 10/899,305, filed Jul. 27, 2004, now U.S. Pat. No. 7,445,273 and a CIP of U.S. Ser. No. 10/989,721, filed Nov. 17, 2004, the entire disclosures of which are all hereby incorporated herein by reference. This application also claims priority on U.S. Provisional Patent Application Nos. 60/529,624, filed Dec. 16, 2003, and 60/529,103, filed Dec. 15, 2003, the disclosures of which are hereby incorporated herein by reference.

This application relates to a coated article including a coating supported by a glass substrate. The coating includes an anti-etch layer that is resistant to fluoride-based etchant(s), and may also include other layer(s) such as a scratch-resistant layer comprising diamond-like carbon (DLC). Coated articles according to different embodiments of this invention may be used as windows or in any other suitable application.

BACKGROUND OF THE INVENTION

Unfortunately, vandals have increasingly been turning to glass etchants as a tool of choice for graffiti. For example, graffiti on glass windows of subway cars is commonplace. Vandals have been forming such graffiti on windows of subway cars, buildings, trains, buses and other glass windows by using glass etchants which are capable of etching glass at locations where such etchants are applied.

Armor-etch is an example of a bifluoride salt (e.g., ammonia bifluoride or sodium bifluoride) based paste used for etching patterns on glass surfaces, and has been used in forming graffiti. The mechanism of fluoride ion attack on $SiO_2$ of glass is summarized below for purposes of example only and understanding.

Though hydrogen fluoride (HF) does not dissociate well, active hydrogen fluoride paste reacts with silicate (which forms the matrix for glass) in the presence of water as in the following equations:

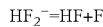

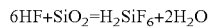

An alternative type of glass etching material, which is also a bi-fluoride based etchant, is sometimes referred to as B&B etching creme manufactured by B&B Etching Products. Ammonium bifluoride ($(NH_4)HF_2$) and sodium bifluoride ($NaHF_2$) salts are very soluble in water. For example, a 2.8 g/100 g solution of ammonium fluoride would produce a 1.7 g/100 g solution of hydrofluoric acid (HF) at pH 1, with 85% of the fluorine atoms in the form of HF. At higher concentrations or higher pH, a significant amount of the $HF_2^-$ ion is present. Acidified fluorides can produce substantial quantities of HF in solution.

The active ammonia bi-fluoride reacts with silicate in the presence of water as presented in the following equations:

$(NH_4)HF_2=(NH_4)^+ +HF_2^-$

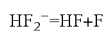

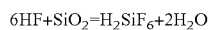

An equilibrium is established between the reactants and products. Thus, as hydrogen fluoride is consumed in reacting with the $SiO_2$ of the glass, more hydrogen fluoride is produced to maintain the equilibrium. The $SiO_2$ etch rate (i.e., the etch rate of the glass) is linearly related to the HF and $HF_2^-$ concentrations, and is not related to the F concentration at any pH.

Conventional coatings used for fluoride resistance to protect glass from such etchings are polymer-based film. Unfortunately, these coatings are susceptible to damage and are not scratch resistant thereby rendering their use in environments such as subway cars, buses and vehicles undesirable. Moreover, in some cases the film can be lifted and the etchant applied under the film.

Scratch resistant coated glass articles are known which utilize a layer(s) comprising diamond-like carbon (DLC) on the glass surface. For example, see U.S. Pat. Nos. 6,261,693, 6,303,226, 6,280,834, 6,284,377, 6,447,891, 6,461,731, 6,395,333, 6,335,086, and 6,592,992, the disclosures of which are all hereby incorporated herein by reference. While carbon is resistant to fluoride ion (and $HF_2^-$) attack, these layers when formed via ion beam deposition techniques at very small thicknesses give rise to micro-particulates on the substrate. When such layers are very thin in nature, these micro-particles may give rise to pinholes which are pathways for the HF to attack the underlying glass. Thus, scratch resistant coated articles which utilize only a layer comprising DLC on the glass are sometimes susceptible to the fluoride based etchant attacks described above.

In view of the above, it can be seen that there exists a need in the art for a scratch resistant coated article which is also resistant to attacks by fluoride-based etchant(s).

BRIEF SUMMARY OF EXAMPLES OF THE INVENTION

A scratch resistant coated article is provided which is also resistant to attacks by at least some fluoride-based etchant(s) for at least a period of time. In certain example embodiments, an anti-etch layer(s) is provided on the glass substrate in order to protect the glass substrate from attacks by fluoride-based etchant(s). In certain example embodiments, the anti-etch layer(s) is substantially transparent to visible light.

In certain example embodiments of this invention, the anti-etch layer may be provided on the substrate over an underlayer(s) of a dielectric material. In certain example embodiments, the dielectric underlayer may be formed using flame pyrolysis in an atmosphere at or close to atmospheric pressure. The use of flame pyrolysis to form the underlayer(s) is advantageous in that the layer(s) formed using flame pyrolysis may be formed in an ambient atmosphere which need not be at a pressure less than atmospheric (as opposed to sputtering for example which is typically formed in a chamber at a low pressure less than atmospheric). Thus, expensive sputtering or other low-pressure deposition systems need not be used to form this particular layer(s). Moreover, another example advantage is that such an underlayer deposited via flame pyrolysis has been found to further improve the etch resistance of the coated article by removing or reducing chemical or other defects on the glass surface. In particular, it is believed that the flame-pyrolysis deposited underlayer removes or reduces chemical defects on the surface on which the anti-etch layer is directly provided. Such defects may lead to growth defects in the anti-etch layer 2 which can be weak points more susceptible to etchant attack. Thus, the removal or reduction of such defects via the use of the flame pyrolysis deposited underlayer is advantageous in that etch resistance can be surprisingly improved.

In certain example embodiments, the anti-etch layer may be provided on the glass substrate, along with an overlying scratch resistant layer of or including diamond-like carbon (DLC). The anti-etch layer may be of or include any suitable material, such as for example the material(s) discussed herein.

In certain example embodiments, the anti-etch layer(s) may comprise or consist essentially of zirconium oxycarbide, hydrogenated zirconium oxycarbide, tin oxycarbide, or hydrogenated tin oxycarbide. In certain example embodiments, the optional underlayer(s) may comprise or consist essentially of silicon oxide, silicon nitride, and/or the like.

In certain example embodiments, there is provided a method of making a coated article, the method comprising providing a glass substrate; using flame pyrolysis to deposit at least one layer on the glass substrate; and forming an anti-etch layer on the glass substrate over the flame pyrolysis deposited layer.

In other example embodiments of this invention, there is provided a coated article comprising a substrate; an underlayer comprising silicon oxide on the substrate; and an anti-etch layer comprising at least one material selected from the group consisting of: zirconium oxycarbide, tin oxycarbide, indium oxide and cerium oxide; and wherein the anti-etch layer is on the substrate over at least the underlayer comprising silicon oxide, and wherein the anti-etch layer is resistant to at least some fluoride-based glass etchants.

DETAILED DESCRIPTION OF EXAMPLE EMBODIMENTS OF THE INVENTION

Figure 1:
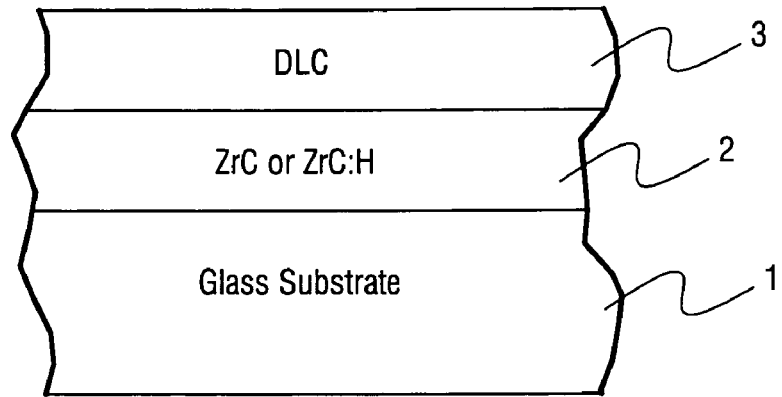
FIG. 1 is a cross sectional view of a coated article according to an example embodiment of this invention.

Referring now more particularly to the accompanying drawings in which like reference numerals indicate like parts/layers throughout the several views.

Coated articles according to certain example embodiments of this invention may be used as subway car windows, transit bus windows, train windows, or other types of vehicle windows, or the like in different applications. Coated articles according to certain example embodiments of this invention may also be used as architectural windows, in monolithic or IG unit form. Coated articles such as windows according to certain example embodiments of this invention may have a visible transmission of at least about 15%, more preferably at least about 50%, more preferably of at least about 60%, and even more preferably of at least about 70%. In certain example embodiments of this invention, any of the coated articles discussed herein may or may not be heat treated (e.g., thermally tempered).

A scratch resistant coated article is provided which is also resistant to attacks by fluoride-based etchant(s). In certain example embodiments, an anti-etch layer(s) is provided on the glass substrate in order to protect the glass substrate from attacks by fluoride-based etchant(s). In certain example embodiments, the anti-etch layer(s) is substantially transparent to visible light (i.e., the anti-etch layer if deposited alone would be transmissive to at least about 60% of visible light, more preferably at least about 70% of visible light, and even more preferably at least about 80% of visible light).

In certain example embodiments of this invention, in a multi-layer stack, a silicon oxide (e.g., $SiO_2$) base layer or underlayer is provided for improving the fluoride etch protection of float glass or other suitable substrate. The silicon oxide base layer may be from about 50 to 1,500 Å thick, more preferably from about 100 to 1,000 Å thick, in certain example embodiments of this invention. The silicon oxide base layer is located on the substrate, and may be located in direct contact with the substrate or alternatively there may be layer(s) between the substrate and the silicon oxide layer. The silicon oxide inclusive base layer may be produced by various method, including MSVD and atmospheric pressure combustion chemical vapor deposition. Other layer(s) in the stack can include a relatively thick intermediate optically transparent layer with inherent fluoride etch resistance, which may be called in anti-etch layer in certain example instances. The anti-etch layer may be from about 500 to 5,000 Å thick in certain example embodiments. The anti-etch layer may be of cerium oxide, indium oxide, zirconium oxycarbide, or tin oxycarbide in certain example embodiments. On large area products, the silicon oxide layer may be produced in a standard in-line MSVD coater, or alternatively by using one or more linear combustion CVD burners that span the width of the glass substrate, with the glass passing under the burners on a conveyor. For two sided coatings, the burners can be installed both above the glass and under the glass between supporting rollers.

In certain example embodiments of this invention, single or multi-layer coatings according to example embodiments of this invention are able to resist HF attack on glass for twenty-four hours or so with no visible sign of significant adverse effect. In example embodiments of this invention, such coatings have a dense structure, are characterized by low pinhole density, and/or are characterized by substantial chemical inertness (e.g., forming insoluble fluorides).

In certain example embodiments, the thickness of the anti-etch layer (see any layer 2 or 2' herein) need not exceed about 0.9 μm (or 9,000 Å). In certain example embodiments, the thickness of the anti-etch layer (2 or 2') may be from about 50 to 9,000 Å, more preferably from 100-5,000 Å. In certain preferred instances, the anti-etch layer (2 or 2') is preferably at least about 2,500 Å thick, and still more preferably from about 3,000 to 5,000 Å thick. Although the anti-etch layer may be thinner than this in certain example embodiments of this invention, if it is thinner than this then etch resistance may suffer undesirably. Moreover, when it is thicker than this range optical properties such as visible transmission or the like may suffer. We note however that t is possible for the anti-etch layer to be thicker (e.g., from 9,000 to 20,000 Å) in certain instances.

FIG. 1 is a cross sectional view of a coated article according to an example embodiment of this invention. The coated article includes a glass substrate 1 (e.g., soda lime silica glass, or borosilicate glass which may or may not be polished) which supports both an anti-etch layer 2 and a scratch resistant layer 3 of or including DLC or the like.

The layer 3 of or including DLC may be any of the DLC inclusive layers described in one or more of U.S. Pat. Nos. 6,261,693, 6,303,226, 6,280,834, 6,284,377, 6,447,891, 6,461,731, 6,395,333, 6,335,086, and/or 6,592,992, and may be deposited/formed in any of the manners described in any of these patents, the disclosures of which are all incorporated herein by reference. For example, and without limitation, DLC inclusive layer 3 may be from about 5 to 1,000 angstroms (Å) thick in certain example embodiments of this invention, more preferably from 10-300 Å thick. In certain example embodiments of this invention, layer 3 including DLC may have an average hardness of at least about 10 GPa, more preferably at least about 20 GPa, and most preferably from about 20-90 GPa. Such hardness renders layer (s) 3 resistant to scratching, certain solvents, and/or the like. Layer 3 may, in certain example embodiments, be of or include a special type of DLC known as highly tetrahedral amorphous carbon (t-aC), and may be hydrogenated (t-aC:H) in certain embodiments (e.g., from 5 to 39% hydrogen, more preferably from 5 to 25% hydrogen, and most preferably from 5 to 20% hydrogen). This type of DLC includes more sp carbon—carbon (C—C) bonds than $sp^2$ carbon—carbon (C—C) bonds. In certain example embodiments, at least about 50% of the carbon-carbon bonds in the layer 3 may be $sp^3$ carbon—carbon (C—C) bonds, more preferably at least about 60% of the carbon-carbon bonds in the layer 3 may be $sp^3$ carbon—carbon (C—C) bonds, and most preferably at least about 70% of the carbon-carbon bonds in the layer 3 may be $sp^3$ carbon—carbon (C—C) bonds. In certain example embodiments of this invention, the DLC inclusive layer 3 may have a density of at least about 2.4 gm/cm$^3$, more preferably of at least about 2.7 gm/cm$^3$. Example linear ion beam sources that may be used to deposit DLC inclusive layer 3 on substrate 1 via an ion beam include any of those in any of U.S. Pat. Nos. 6,359,388, 6,261,693, 6,002,208, 6,335,086, 6, 303,226, or 6,303,225 (all incorporated herein by reference). When using an ion beam source to deposit layer(s) 3, hydrocarbon feedstock gas(es) (e.g., $C_2H_2$), HMDSO, or any other suitable gas, may be used in the ion beam source in order to cause the source to emit an ion beam toward substrate 1 for forming DLC inclusive layer(s) 3. It is noted that the hardness and/or density of layer(s) 3 may be adjusted by varying the ion energy of the depositing apparatus. The use of DLC inclusive layer 3 allows the coated article (e.g., monolithic window, or IG unit) to be more scratch resistant than if the coating were not provided.

In certain example embodiments of this invention, the glass substrate 1 may be ion beam milled before the anti-etch layer 2 (or layer 4) is deposited thereon. The ion beam milling of the glass substrate has been found to remove certain defects on the glass surface thereby resulting in a more durable end product. For example and without limitation, any of the example techniques of ion beam milling described in U.S. Pat. No. 6,368,664 may be used to ion beam mill the glass substrate 1 in this regard, the disclosure of the '664 being incorporated herein by reference. In the FIG. 1 embodiment for example, after ion beam milling the glass substrate (e.g., to remove at least about 2 Å of glass from the substrate, more preferably at least about 5 Å, and possibly at least about 10 Å), the anti-etch layer 2 may be deposited using magnetron sputtering or EBAD in different embodiments of this invention. Thereafter, the DLC inclusive layer 3 may be ion beam deposited over the anti-etch layer 2. Stack configurations may be produced by one-pass in-line deposition in a suitably configured system, or in any other suitable manner.

Anti-etch layer(s) 2 is provided to allow the coated article to be resistant to attacks by fluoride-based etchant(s) such as those discussed above. The anti-etch layer 2 may be deposited by sputtering, ion beam deposition, or ion beam assist deposition (IBAD) in different embodiments of this invention. Anti-etch layer 2 substantially prevents (or reduces) fluoride-based etchant(s) such as those discussed above from reaching the glass substrate 1 for at least a period of time (e.g., for at least one hour, more preferably for at least twelve hours, and most preferably for at least twenty-four hours), thereby rendering the coated article more resistant to attacks by fluoride-based etchant(s) such as those discussed above. Moreover, since certain embodiments of this invention are used in the context of window applications, the anti-etch layer(s) 2 is substantially transparent to visible light.

It has been found that the inclusion of carbon into an inorganic layer 2 or coating significantly improves the resistance of the coated glass article to corrosion by fluoride etching. In certain example embodiments, at least carbon inclusive reactive gas (e.g., acetylene ($C_2H_2$) and/or $CO_2$) is used during the deposition process of anti-etch layer 2 in order to provide carbon in the resulting layer thereby improving the corrosion resistance of the layer and the coated article. As shown in FIG. 1, the anti-etch layer 2 may comprise or consist essentially of zirconium oxycarbide (e.g., ZrOC), zirconium carbide (ZrC), hydrogenated zirconium oxycarbide (e.g., ZrOC:H), and/or hydrogenated zirconium carbide (e.g., ZrC:H). These materials are advantageous in that zirconium carbide is very scratch resistant, thereby improving the mechanical durability of the coated article in addition to being etch resistant. In this respect, zirconium carbide (even if it also includes oxygen) tends to be a very hard and durable material. In certain example embodiments of this invention, the zirconium carbide inclusive layer 2 may be formed (e.g., via sputtering or EBAD) so as to have an average hardness of at least about 20 GPa, more preferably of at least about 25 GPa, still more preferably of at least about 27 GPa, and most preferably of at least about 29 GPa.

Moreover, another advantage associated with these materials is that zirconium carbide (whether or not hydrogenated and/or oxided) is fairly resistant to oxidation in environments where it is exposed to UV rays and/or water—this is an improvement over DLC alone in certain example non-limiting embodiments of this invention.

It has surprisingly been found that when Zr (or Sn as discussed below) is reactively sputter-deposited or otherwise deposited using a carbon inclusive gas such as $C_2H_2$ plus $O_2$, or $CO_2$ (optionally in addition to Ar gas for example), the resulting coating and coated article realizes significantly improved resistance to fluoride based etching compared to a situation where the Zr (or Sn) is reactively deposited using only $O_2$ gas (in addition to Ar). It is believed that the surprisingly improved resistance resulting from the inclusion of carbon in the gas and thus the layer is due to the carbon's inert characteristics. While these surprisingly results are associated with Zr, the Zr may be replaced with any of the following materials in any layer 2 herein: Sn, Ti, Hf, V, Nb or Ta (it is expected that these surprisingly results will also be applicable to these materials).

As mentioned above, the ZrC or ZrOC may be hydrogenated in certain example embodiments of this invention. In hydrogenated embodiments (e.g., ZrC:H or ZrOC:H), the hydrogen content of the layer may be from about 1-40%, more preferably from about 5-35%, and even more preferably from about 5-25%.

As explained above, when the DLC layer is provided, it is typically deposited by an ion beam technique over the Zr inclusive anti-etch layer 2. In such instances, due to the high energy which may be used in ion beam depositing DLC inclusive layer 3, the DLC may alloy with the Zr at the interface between layers 2 and 3. Thus, a thin layer comprising an alloy of Zr and DLC may be provided between layers 2 and 3 in certain example embodiments of this invention.

Figure 2:
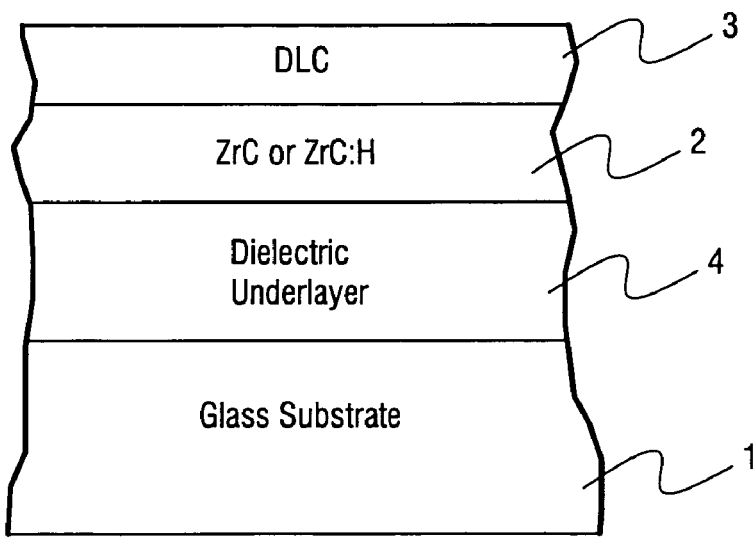
FIG. 2 is a cross sectional view of a coated article according to another example embodiment of this invention.

FIG. 2 illustrates another example embodiment of this invention where an underlayer 4 (e.g., silicon nitride, silicon oxide {e.g., $SiO_2$ or any other suitable stoichiometry}, or silicon oxynitride) is provided between the glass substrate 1 and the anti-etch layer 2 discussed above. Of course, any of the aforesaid anti-etch layers 2 may be used as layer 2 in this embodiment. In certain example instances, the underlayer 4 (which is preferably a dielectric) has been found to further improve the etch resistance of the coated article by removing or reducing chemical or other defects on the glass surface. In particular, it is believed that the underlayer 4 of silicon oxide for example removes or reduces chemical defects on the surface on which the anti-etch layer is directly provided. Such defects may lead to growth defects in the anti-etch layer 2 which can be weak points more susceptible to etchant attack. Thus, the removal or reduction of such defects via the use of silicon oxide or the like is advantageous in that etch resistance can be surprisingly improved. The silicon oxide or the like of the underlayer 4 may be formed in any suitable manner, such as by magnetron sputtering, flame pyrolysis (combustion-CVD), etc. An example advantage of flame pyrolysis or combustion-CVD is that it is an atmospheric pressure process and does not require expensive hardware typically associated with low pressure processes such as sputtering.

In certain example embodiments of this invention, any of the underlayers 4 may have a thickness of from about 30 to 800 Å, more preferably from about 50 to 500 Å, and most preferably from about 100 to 400 Å.

Figure 3:
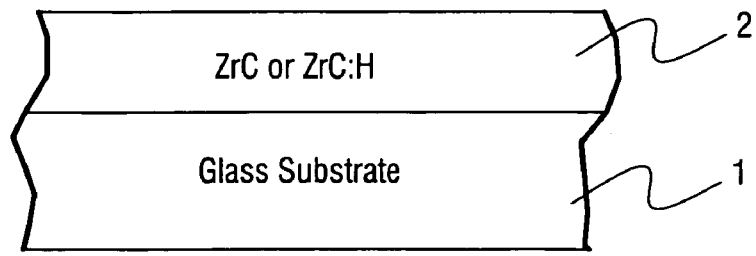
FIG. 3 is a cross sectional view of a coated article according to another example embodiment of this invention.

FIG. 3 illustrates another example embodiment of this invention where the anti-etch layer 2 alone is provided on the glass substrate. There need not be any protective layer over the anti-etch layer 2 in this embodiment. Again, any of the aforesaid anti-etch layers 2 may be used as layer 2 in this FIG. 3 embodiment. In other words, the anti-etch layer 2 in the FIG. 2-3 embodiments may be made of or include any of the materials listed above with respect to layer 2 in the FIG. 1 embodiment.

It has been found that the deposition temperature for the anti-etch layer 2 may in certain instances play a role in etch resistance. In certain example instances, sputter-depositing anti-etch layer 2 at elevated temperatures results in unexpectedly improved etch resistance. In certain example embodiments, the anti-etch layer 2 (or 2') is deposited by sputtering onto a glass substrate 1 (with or without an underlayer(s) 4 therebetween) at a temperature of at least about 100 degrees C., more preferably of at least 200 degrees C., still more preferably at least 300 degrees C., even more preferably of at least 400 degrees C., and sometimes at least 450 degrees C. It is believed that the higher temperatures increase the energy provided during the layer formation process and increase the density of the layer thereby improving anti-etch characteristics. However, in other example instances, elevated temperatures are not used and the deposition may take place at room temperature or the like.

Figure 7:
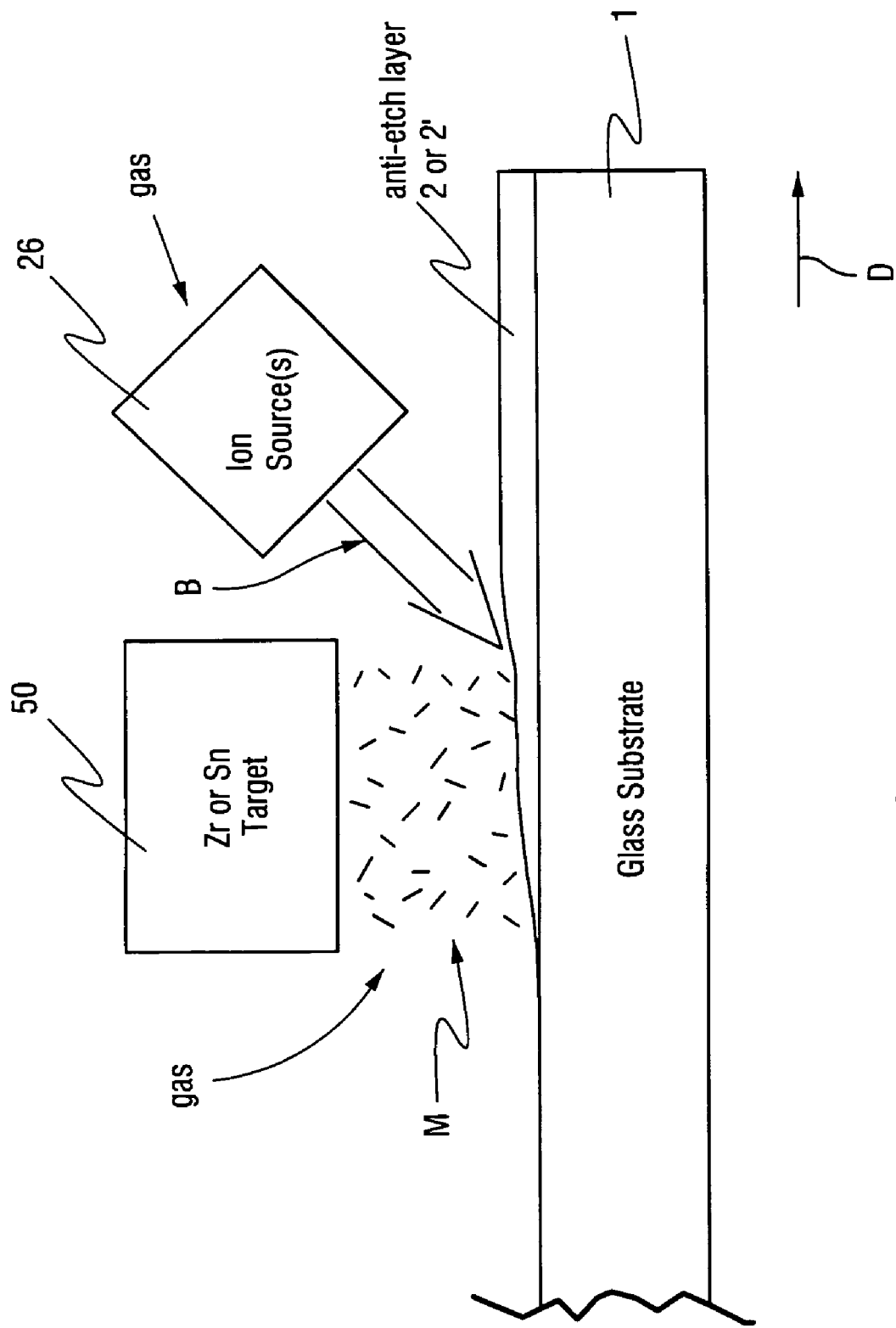
FIG. 7 is a schematic diagram illustrating an example method of depositing and/or forming an anti-etch layer according to an example embodiment of this invention.

As an alternative to using high temperatures when forming the anti-etch layer, the anti-etch layer 2 may be formed using IBAD in certain example embodiments of this invention. Again, the advantage of using IBAD is that the ion beam(s) used during IBAD layer formation adds energy to the layer formation process and causes a more dense layer to be formed. Again, it is believed that this improves anti-etch characteristics of the layer 2. In an IBAD process, both an ion beam(s) and material from a sputtering target(s) simultaneously impinge on the substrate in order to form the layer being deposited. FIG. 7 illustrates and example of using IBAD to form/deposit anti-etch layer 2. As shown, in this IBAD embodiment both an ion beam source(s) 26 and a sputtering device including a sputtering target(s) 50 are used. An ion beam B from the ion beam source 26 intersects with the material M sputtered from the sputtering target(s) 50 proximate the surface where at least part of the anti-etch layer 2 (or 2') is being grown, so that at least part of the anti-etch layer 2 is grown/formed by a simultaneous combination of both the ion beam and sputtering. Substrate 1 is preferably moving in direction D during the layer formation process.

In a pure sputtering embodiment where anti-etch layer 2 (or 2') is formed by sputtering only with no ion source, or alternatively in the FIG. 7 IBAD embodiment, gas including carbon such as gas comprising $C_2H_2$ and/or $CO_2$ may be introduced to a sputtering chamber proximate the sputtering target 50 (e.g., of Zr, Sn or the like) so that a layer 2 comprising ZrC:H and/or ZrC is formed on (directly or indirectly) the substrate 1. It will be appreciated that when it is desired to hydrogenate the layer, the gas should include hydrogen and may comprise a hydrocarbon gas for example (e.g., $C_2H_2$). In addition to the carbon inclusive gas, gas(es) such as Ar and/or $O_2$ may also be introduced into the sputtering chamber proximate target 50. When $O_2$ gas is also introduced in addition to $C_2H_2$ and/or $CO_2$ gas proximate the target 50, then a layer 2 comprising ZrOC:H and/or ZROC is formed on (directly or indirectly) the substrate 1. An example gas introduction is 90 sccm of Ar gas and 20 sccm of $C_2H_2$ gas being introduced into the sputter zone proximate the target 50. The sputter zone is typically at a pressure less than atmospheric pressure (e.g., at 2 to 3 mTorr). Moreover, when ion source 26 is used in the formation process for layer 2, then gas such as Ar and/or $C_2H_2$ may be introduced into the ion source 26. In such situations, the ion source 26 may emit ions such as Ar ions, C ions and/or H ions in beam B toward the layer formation area on the substrate.

Figure 4:
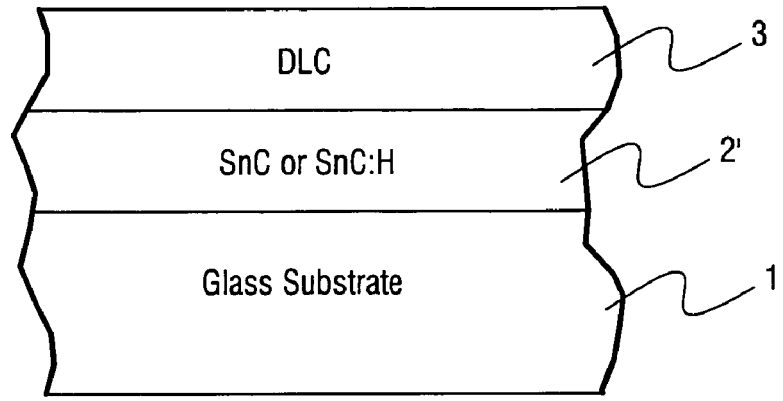
FIG. 4 is a cross sectional view of a coated article according to another example embodiment of this invention.
Figure 5:
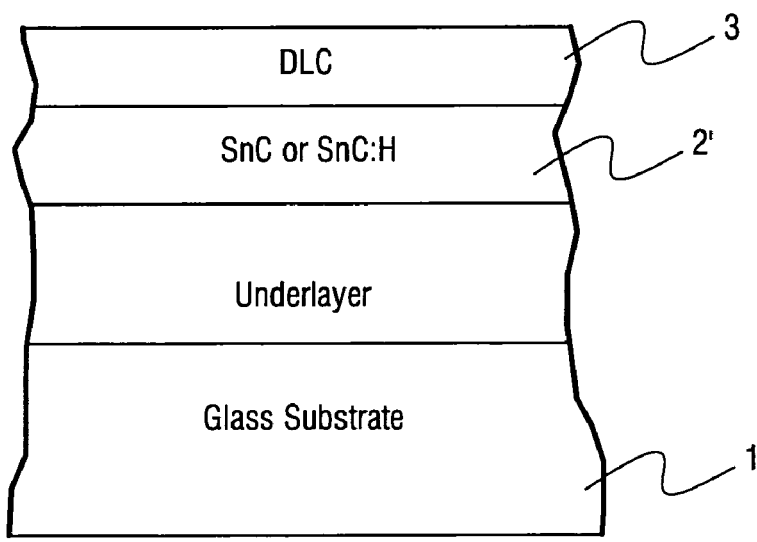
FIG. 5 is a cross sectional view of a coated article according to another example embodiment of this invention.
Figure 6:
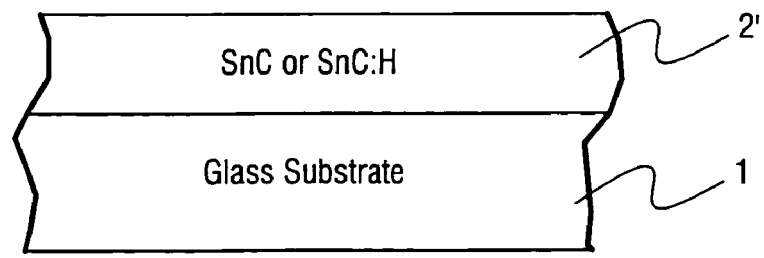
FIG. 6 is a cross sectional view of a coated article according to another example embodiment of this invention.

As explained above, while Zr is used as a metal in the embodiments of FIGS. 1-3, this invention is not so limited unless expressly claimed. In this respect, FIGS. 4-6 emphasize that the Zr in any of the embodiments described herein, or shown in FIGS. 1-3, may be replaced with Sn in certain example embodiments of this invention.

It is noted that any of the aforesaid materials for anti-etch layers 2 (or 2') may also be nitrided in certain example embodiments of this invention. In particular, nitrogen gas may also be used in the sputter-deposition process for example in order to at least partially nitride the anti-etch layer in certain alternative embodiments of this invention. For example, and without limitation, the anti-etch layer 2 may comprise or consist essentially of zirconium carbide oxynitride (e.g., ZrCON), zirconium carbide nitride (ZrCN), hydrogenated zirconium carbide oxynitride (e.g., ZrCON:H), and/or hydrogenated zirconium carbide nitride (e.g., ZrCN:H).

Figure 8:
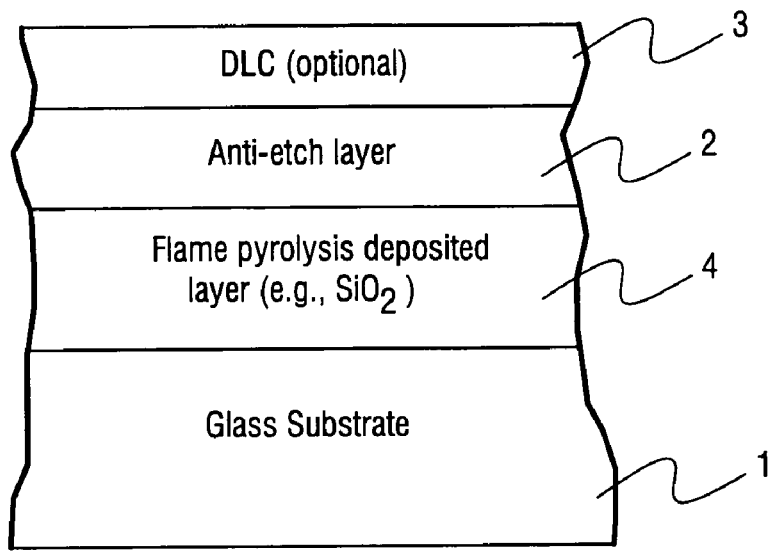
FIG. 8 is a cross sectional view of a coated article according to another example embodiment of this invention.

FIG. 8 is a cross sectional view of an example coated article, generally speaking according to an example embodiment. The anti etch layer 2 (or 2') may be made of or comprise one or more of the following materials in certain embodiments of this invention. Example materials, resistant to attacks by fluoride-based etchant(s), which may be used for layer 2 (or 2') include: nitrides of Al, Si, Nb, Cr and/or Ni, oxides of Al, Si, Ge, Mg, Nb, Mn, V, W, Hf, Ce, and/or Sn, carbides of Si and/or W, fluorides of Mg, Ba and/or Ca, borides of Zr, Ni, Co and/or Fe, oxides of Mo, In, Ta, Ni, Nb, Cu, MoIn, MoTa, and/or NiCu, and oxynitrides of Mo, In, Ta, Ni, Nb, Cu, MoIn, MoTa, and/or NiCu. Other possible materials for any anti-etch layer 2 (or 2') herein include zirconium oxycarbide ($ZrO_xC_y$), tin oxycarbide ($SnO_xC_y$), zirconium nitride carbide ($ZrN_xC_y$), and/or tin nitride carbide ($Sn_xNC_y$). The DLC inclusive layer 3 is optional.

Moreover, in the FIG. 8 embodiment, the dielectric underlayer 4 is formed using flame pyrolysis in an atmosphere at or close to atmospheric pressure. Thus underlayer 4 formed in such a manner is of a material such as silicon oxide (e.g., $SiO_2$). The use of flame pyrolysis to form the underlayer(s) is advantageous in that the layer(s) formed using flame pyrolysis may be formed in an ambient atmosphere which need not be at a pressure less than atmospheric. Thus, expensive sputtering or other low-pressure deposition systems need not be used to form this particular layer(s). Moreover, another example advantage is that such an underlayer deposited via flame pyrolysis has been found to further improve the etch resistance of the coated article by removing or reducing chemical or other defects on the glass surface. In particular, it is believed that the flame-pyrolysis deposited underlayer 4 removes or reduces chemical defects on the surface on which the anti-etch layer is directly provided. Such defects may lead to growth defects in the anti-etch layer 2 which can be weak points more susceptible to etchant attack. In certain respects, the flame-pyrolysis deposited layer (e.g., silicon oxide) 4 acts as a barrier layer to prevent certain defects and/or elements present at the glass surface (e.g., sodium, protrusions, etc.) from reaching and damaging the anti-etch layer. Thus, the removal or reduction of such defects via the use of the flame pyrolysis deposited underlayer is advantageous in that etch resistance can be surprisingly improved.

For purposes of example, and without limitation, consider the following examples of flame pyrolysis which may be used in certain embodiments of the instant invention to form a layer(s) 4 on the glass substrate. A combustion gas or fuel gas such as propane, and a silicon inclusive compound such as $SiH_4$, organosilane, tetraethoxysilane (TEOS), HMDSO, organosiloxane, or the like, may be introduced into the flame in order to cause a thin layer 4 of silicon oxide to form on the substrate 1, either directly or indirectly. The silicon oxide may include small amounts of other elements in certain instances. Other examples of flame pyrolysis are described in U.S. Pat. Nos. 4,600,390, 4,620,988, 3,883,336, and 5,958,361, the disclosures of which are hereby incorporated herein by reference.

Figure 9:
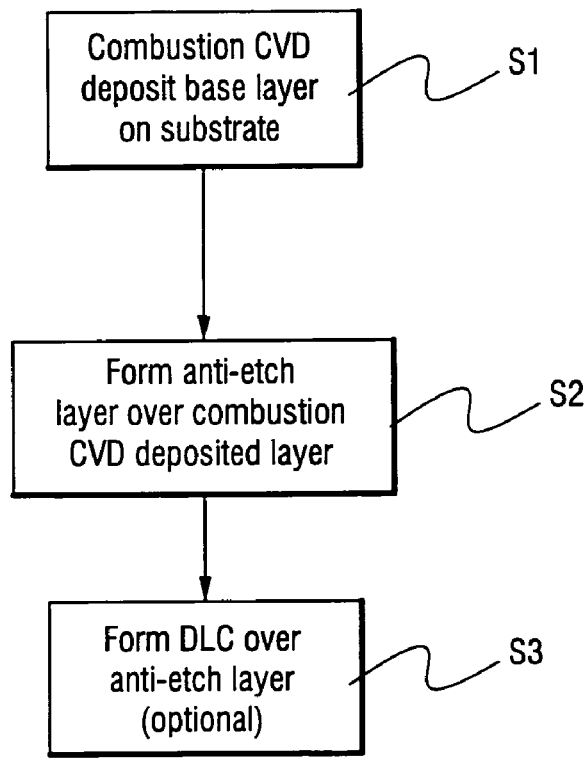
FIG. 9 is a flowchart listing certain example steps performed in making the coated article of FIG. 8 according to an example embodiment of this invention.

FIG. 9 is a flowchart illustrating certain example steps performed in making the coated article of FIG. 8. First, after a glass substrate 1 is provided, flame pyrolysis is used to deposit a base layer 4 of silicon oxide or the like on the substrate (S1). Then, the anti-etch layer 2 is formed on the substrate 1 over the base layer 4, via sputtering or the like (S2). Then, optionally, a scratch resistant layer 3 of a material such as DLC is formed on the substrate 1 over layers 2, 4.

EXAMPLES

The following examples are provided for purposes of example only and are not intended to be limiting unless expressly claimed.

Examples 1 and 2 formed a Zr inclusive layer using a Zr sputtering target on a glass substrate. The Example 1 layer was of ZrO and had no carbon, whereas the Example 2 layer was of ZrOC:H and thus did include carbon. By comparing Examples 1 and 2, it can be seen that the provision of carbon in the layer significantly improve corrosion resistance of the layer. The layers of Examples 1 and 2 were deposited on the glass substrate 1 using the following sputtering process parameters. The parameters Ar, $O_2$, $CO_2$, $C_2H_2$, and $N_2$ illustrate how much gas flow was used in the sputtering process in the sputtering chamber atmosphere for each of these gases, in units of sccm. In each of Examples 1-2, a power of 8 kW was used, 9 passes by the target were performed, the line rate was about 15.4 inches per minute. The layer deposited in Example 1 ended up about 102 nm thick, whereas the layer in Example 2 ended up about 265 nm thick.

Examples 1-2

Sputtering Process Parameters—Zr Target

| | Ar | $O_2$ | $CO_2$ | $C_2H_2$ | $N_2$ |
| --- | --- | --- | --- | --- | --- |
| Ex. 1 | 200 | 75 | 0 | 0 | 0 |
| Ex. 2 | 200 | 0 | 50 | 50 | 0 |

Thus, it will be appreciated that given the gases used in sputtering the Zr inclusive layers in Examples 1 and 2, the Example 1 layer was of ZrO and had no carbon, whereas the Example 2 layer was of ZrOC:H since carbon dioxide and acetylene gases were used and thus did include carbon. The Example 1 coated article had a visible transmission of about 75%, whereas the Example 2 coated article had a visible transmission of about 66%.

Examples 1-2 were then exposed to a fluoride etchant for the same amount of time in order to compare the corrosion resistance of the two layers. Surprisingly, it was observed that after about 3 minutes of exposure to the etchant, about 100% of the Example 1 layer had been removed whereas about 0% of the Example 2 layer had been removed. Moreover, after about 10 minutes of exposure to the etchant, only about 5% of the Example 2 layer had been removed due to the etchant, mostly via pinholes. Thus, it can be seen by comparing Examples 1 and 2, that the provision of carbon in the layer significantly improve corrosion resistance of the layer. In particular, the Example 2 layer with carbon was much more resistant to corrosion than was the Example 1 layer without carbon.

Examples 3 and 4 are additional examples of certain embodiments of this invention, where Zr inclusive anti-etch layers 2 were deposited on a glass substrate 1 via sputtering using Zr sputtering targets. In each of Examples 3-4, a power of 8 kW was used, 9 passes by the target were performed, the line rate was about 15.4 inches per minute. The layer deposited in Example 3 ended up about 285 nm thick, whereas the layer in Example 4 ended up about 172 nm thick.

Examples 3-4

Sputtering Process Parameters—Zr Target

|  | Ar | $O_2$ | $CO_2$ | $C_2H_2$ | $N_2$ |
|---|---|---|---|---|---|
| Ex. 3 | 200 | 10 | 0 | 50 | 50 |
| Ex. 4 | 200 | 25 | 0 | 50 | 50 |

Thus, it will be appreciated that given the gases used in sputtering the Zr inclusive layers in Examples 3 and 4, each of the anti-etch layers 2 of Examples 3 and 4 was of hydrogenated zirconium carbide oxynitride (e.g., ZrCON:H). The Example 3 coated article had a visible transmission of about 21%, whereas the Example 4 coated article had a visible transmission of about 57%. Examples 3-4 were then exposed to a fluoride etchant for the same amount of time in order to compare the corrosion resistance of the two layers. Surprisingly, it was observed that after about 3 minutes of exposure to the etchant, about 0% of the Example 3 layer and about 0% of the Example 4 layer had been removed. Moreover, after about 10 minutes of exposure to the etchant, only about 5% of the Example 4 layer and 0% of the Example 3 layer had been removed due to the etchant.

Examples 5 and 6 formed a Sn inclusive layer using a Sn sputtering target on a glass substrate. The Example 5 layer was of SnO (probably a version of SnO known as $SnO_2$) and had no carbon, whereas the Example 6 layer was of SnOC and thus did include carbon and did not include hydrogen. By comparing Examples 5 and 6, it can be seen that the provision of carbon in the layer significantly improve corrosion resistance of the layer. The layers of Examples 5 and 6 were deposited on the glass substrate 1 using the following sputtering process parameters. The parameters Ar, $O_2$, $CO_2$, $C_2H_2$, and $N_2$ illustrate how much gas flow was used in the sputtering process in the sputtering chamber atmosphere where the target was located for each of these gases, in units of sccm. In Example 5 a power of 20 kW was used and in Example 6 a power of 5 kW was used. In each of Examples 5-6, 1 pass by the target was performed, and the line rate was about 15.4 inches per minute. The layer deposited in Example 5 ended up about 79 nm thick, whereas the layer in Example 6 ended up about 45 nm thick.

Examples 5-6

Sputtering Process Parameters—Sn Target

|  | Ar | $O_2$ | $CO_2$ | $C_2H_2$ | $N_2$ |
|---|---|---|---|---|---|
| Ex. 5 | 250 | 550 | 0 | 0 | 0 |
| Ex. 6 | 250 | 0 | 460 | 0 | 0 |

Thus, it will be appreciated that given the gases used in sputtering the Sn inclusive layers in Examples 5 and 6, the Example 5 layer was of SnO and had no carbon, whereas the Example 6 layer was of SnOC since carbon dioxide was used and thus did include carbon. The Example 5 coated article had a visible transmission of about 74%, whereas the Example 6 coated article had a visible transmission of about 70%.

Examples 5-6 were then exposed to a fluoride etchant for the same amount of time in order to compare the corrosion resistance of the two layers. Surprisingly, it was observed that after about 3 minutes of exposure to the etchant, about 15% of the Example 5 layer had been removed whereas only about 10% of the Example 6 layer had been removed. Thus, it can be seen by comparing Examples 5 and 6, that the provision of carbon in the layer improved corrosion resistance of the layer. In particular, the Example 6 layer with carbon was more resistant to corrosion than was the Example 5 layer without carbon.

A flame pyrolysis deposited dielectric layer (e.g., silicon oxide) may be formed between the glass substrate and the anti-etch layer in any of Examples 1-6.

Examples 7-8 illustrate example advantages associated with the use of an underlayer 4 of silicon oxide under an anti-etch layer 2 on a float glass substrate 1. For Example 7, a MSVD $SiO_2$ layer about 100 Å thick was deposited on a float glass substrate. An anti-etch layer of cerium oxide was then deposited on the substrate over the $SiO_2$ layer, and fluoride based etch resistance testing was performed using Armor Etch. Comparing samples (Example 8) without the $SiO_2$ layer with samples (Example 7) with the $SiO_2$ layer, much less damage (primarily in the form of pinholes) was observed on the sample (Example 7) having the $SiO_2$ layer under the anti-etch layer. Thus, the unexpected advantages associated with the use of the silicon oxide underlayer 4 are clear.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article comprising:
    a substrate;
    a flame pyrolysis-deposited underlayer comprising silicon oxide on the substrate; and
    an anti-etch layer comprising at least one material selected from the group consisting of: zirconium oxycarbide, tin oxycarbide, indium oxide and cerium oxide; and
    wherein the anti-etch layer is on the substrate over at least the underlayer comprising silicon oxide, and wherein the anti-etch layer is resistant to at least some fluoride-based glass etchants.

2. The coated article of claim 1, wherein the anti-etch layer comprises zirconium oxycarbide, and wherein the substrate is a glass substrate.

3. The coated article of claim 1, wherein the coated article is a window.

4. The coated article of claim 1, wherein the coated article has a visible transmission of at least about 50%.

5. The coated article of claim 1, further comprising an ion beam-deposited layer comprising diamond-like carbon (DLC) on the glass substrate over the anti-etch layer.

6. The coated article of claim 1, wherein the anti-etch layer is resistant to corrosion by fluoride inclusive etchants.

7. The coated article of claim 1, wherein the anti-etch layer is at least about 2,500 Å thick.

8. The coated article of claim 1, wherein the anti-etch layer is at least partially nitrided.

* * * * *